(12) United States Patent
Tang

(10) Patent No.: US 10,453,702 B2
(45) Date of Patent: Oct. 22, 2019

(54) CHEMICAL MECHANICAL POLISHING DEVICE AND CHEMICAL MECHANICAL POLISHING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Qiang Tang, Shanghai (CN)

(73) Assignees: SEMICONDUCTOR MANF. INTL. (SHANGHAI) CORPORATION, Shanghai (CN); SEMICONDUCTOR MANF. INTL. (BEIJING) CORPORATION, Beijing (CN)

( * ) Notice: Subject to any disclaimer, the term of this patent is extended or adjusted under 35 U.S.C. 154(b) by 160 days.

(21) Appl. No.: 15/814,224

(22) Filed: Nov. 15, 2017

(65) Prior Publication Data
US 2018/0151388 A1 May 31, 2018

(30) Foreign Application Priority Data
Nov. 29, 2016 (CN) .......................... 2016 1 1066947

(51) Int. Cl.
*B24B 53/00* (2006.01)
*H01L 21/321* (2006.01)
(Continued)

(52) U.S. Cl.
CPC .......... *H01L 21/3212* (2013.01); *B24B 37/24* (2013.01); *B24B 47/12* (2013.01);
(Continued)

(58) Field of Classification Search
CPC ....... B24B 49/04; B24B 53/017; B24B 53/00; C09G 1/02; H01L 21/321; H01L 21/3212

USPC ..... 451/5, 41, 287, 288, 289, 290, 443, 444, 451/72, 56
See application file for complete search history.

(56) References Cited

U.S. PATENT DOCUMENTS 6,319,105 B1 * 11/2001 Togawa ................ B24B 53/017
134/153
6,358,124 B1 * 3/2002 Koga ...................... B08B 1/007
451/444

(Continued)

FOREIGN PATENT DOCUMENTS

CN 1947945 A 4/2007
CN 101022921 A 8/2007
(Continued)

*Primary Examiner* — Robert A Rose
(74) *Attorney, Agent, or Firm* — Brinks Gilson & Lione

(57) ABSTRACT

The present disclosure describes a chemical mechanical polishing device and a chemical mechanical polishing method. The chemical mechanical polishing device includes: a cleaning apparatus and a polishing pad conditioner disc positionally configurable relative to the cleaning apparatus, where the cleaning apparatus includes: a cleaning disc; a pre-polishing pad disposed inside the cleaning disc and configured to perform a pre-polishing operation of the polishing pad conditioner disc when positioned in contact with the polishing pad conditioner disc; a pre-polishing grinding liquid dispensing assembly disposed on a side edge of the cleaning disc and configured to supply a pre-polishing grinding liquid to the pre-polishing pad; and a rotation driver configured to drive the pre-polishing pad to rotate during the pre-polishing operation. The present disclosure beneficially reduces wafer scratches and increases evenness of distribution of a grinding liquid during polishing.

23 Claims, 4 Drawing Sheets

(51) Int. Cl.
  *B24B 47/12* (2006.01)
  *B24B 49/04* (2006.01)
  *C09G 1/02* (2006.01)
  *B24B 37/24* (2012.01)
  *B24B 53/017* (2012.01)
  B24B 37/04 (2012.01)
  B24D 13/14 (2006.01)

(52) U.S. Cl.
  CPC ............ *B24B 49/04* (2013.01); *B24B 53/017* (2013.01); *C09G 1/02* (2013.01); *B24B 37/042* (2013.01); *B24D 13/147* (2013.01)

(56) References Cited

U.S. PATENT DOCUMENTS

| | | | | |
|---|---|---|---|---|
| 6,878,045 | B2* | 4/2005 | Janzen | B24B 1/04 451/288 |
| 2005/0070215 | A1* | 3/2005 | Kim | B08B 3/02 451/285 |
| 2005/0079811 | A1* | 4/2005 | Cheng | B24B 37/24 451/443 |
| 2008/0311834 | A1* | 12/2008 | Lafon | B24B 1/04 451/444 |
| 2010/0035526 | A1* | 2/2010 | Tolles | B08B 1/007 451/57 |
| 2011/0244763 | A1* | 10/2011 | Yuan | B24B 53/017 451/56 |

FOREIGN PATENT DOCUMENTS

| | | |
|---|---|---|
| CN | 202825548 U | 5/2013 |
| CN | 104842259 A | 8/2015 |
| JP | 2001-328069 A | 11/2001 |

* cited by examiner

CHEMICAL MECHANICAL POLISHING DEVICE AND CHEMICAL MECHANICAL POLISHING METHOD

CROSS REFERENCE TO RELATED APPLICATIONS

This application is based on and claims priority to Chinese Patent Application CN201611066947.8, filed Nov. 29, 2016, the entire content of which is incorporated herein by reference.

BACKGROUND

Technical Field

The present disclosure relates to the field of semiconductor technologies, and in particular, to a chemical mechanical polishing device and a chemical mechanical polishing method.

Related Art

A grinding liquid for Chemical Mechanical Polishing (CMP) is used to polish copper, tungsten and other metals or oxide. The grinding liquid is supplied to a rotary disc with a flow rate that can be set or controlled for polishing the metal or oxide on a surface of a wafer. With regard to the CMP, consumption of the grinding liquid accounts for a large part of costs, and evenness of distribution of the grinding liquid in the grinding process is relatively poor. In addition, under high-speed rotation, a large amount of grinding liquid would be removed from a polishing pad due to the rotation, resulting in waste of the grinding liquid. Moreover, in the CMP processes disclosed in prior art, scratching of the wafers sometimes occurs.

In the CMP, it is also necessary to periodically clean a diamond disc of the CMP. FIG. 1 is a schematic diagram illustratively showing a partial structure of a diamond disc cleaning arrangement for an existing CMP device. FIG. 1 shows a diamond disc 101, a cleaning disc 102, deionized water (DIW for short) 103, and a polishing pad conditioner arm 104. A polishing pad conditioner may include the diamond disc 101 and the polishing pad conditioner arm 104. After the diamond disc 101 completes a polishing operation, the polishing pad conditioner arm 104 transfers the diamond disc 101 from a polishing pad (not shown in FIG. 1) to the cleaning disc 102 to clean the diamond disc 101 by using the DIW 103.

SUMMARY

The inventor of the present disclosure finds the problems existing the foregoing prior art and proposes a novel technical solution directed to at least one of the problems.

In one aspect of the present disclosure, a chemical mechanical polishing device is provided and includes: a cleaning apparatus and a polishing pad conditioner disc positionally configurable relative to the cleaning apparatus, where the cleaning apparatus includes: a cleaning disc; a pre-polishing pad, disposed inside the cleaning disc and configured to perform a pre-polishing operation of the polishing pad conditioner disc when positioned in contact with the polishing pad conditioner disc; a pre-polishing grinding liquid dispensing assembly, disposed on a side edge of the cleaning disc and configured to supply a pre-polishing grinding liquid to the pre-polishing pad; and a rotation driver configured to drive the pre-polishing pad to rotate during the pre-polishing operation.

In a form, a range of a diameter of the pre-polishing pad is 20 cm to 22 cm.

In a form, the pre-polishing pad is fixedly disposed inside the cleaning disc and is coaxial with the cleaning disc; and the rotation driver is coaxially connected to the cleaning disc.

In a form, a rotation speed of the cleaning disc is 15 r/min to 20 r/min.

In a form, the pre-polishing grinding liquid dispensing assembly includes a pre-polishing grinding liquid nozzle disposed on the side edge of the cleaning disc.

In a form, the pre-polishing grinding liquid dispensing assembly includes two pre-polishing grinding liquid nozzles, where the two pre-polishing grinding liquid nozzles are respectively disposed on two sides of the cleaning disc.

In a form, a range of a flow rate of the pre-polishing grinding liquid is 30 ml/min to 35 ml/min.

In a form, in a process of performing the pre-polishing operation, a range of a rotation speed of the polishing pad conditioner disc is 15 r/min to 20 r/m in.

In a form, the polishing pad conditioner disc includes a diamond disc.

In a form, the cleaning apparatus further includes: a cleaning liquid dispensing assembly, disposed on the side edge of the cleaning disc and configured to perform a cleaning operation on the polishing pad conditioner disc.

In a form, when the cleaning liquid dispensing assembly performs the cleaning operation on the polishing pad conditioner disc, the polishing pad conditioner disc is positioned above the cleaning disc.

In a form, the cleaning liquid dispensing assembly includes a cleaning liquid nozzle disposed on the side edge of the cleaning disc.

In a form, the cleaning liquid dispensing assembly includes two cleaning liquid nozzle respectively disposed on two sides of the cleaning disc.

In a form, a range of a flow rate of the cleaning liquid is 100 ml/min to 120 ml/min.

In a form, the cleaning apparatus includes: a liquid discharging disc, disposed below the cleaning disc and configured to discharge a waste liquid after the pre-polishing operation or the cleaning operation.

In a form, the chemical mechanical polishing device further includes: a rotary disc, a polishing pad, a grinding head, a polishing grinding liquid dispensing assembly, and a polishing pad conditioner arm, where the rotary disc is configured to drive the polishing pad to rotate; the polishing pad is disposed on the rotary disc and configured to perform a polishing operation in combination with the grinding head and the polishing pad conditioner disc; the grinding head is disposed above the polishing pad and configured to hold a wafer and position the wafer into contact with an upper surface of the polishing pad when the polishing operation is performed; the polishing grinding liquid dispensing assembly is disposed above the polishing pad and configured to supply a polishing grinding liquid to the polishing pad; and the polishing pad conditioner arm is connected to the polishing pad conditioner disc and configured to move the polishing pad conditioner disc relative to the polishing pad.

In a form, a range of a flow rate of the polishing grinding liquid is 140 ml/min to 150 ml/min.

The chemical mechanical polishing device of the present disclosure beneficially reduces wafer scratches and increases evenness of distribution of the grinding liquid during polishing.

Further, the foregoing chemical mechanical polishing device also beneficially saves consumption of a polishing grinding liquid.

In another aspect of the present disclosure, a chemical mechanical polishing method is provided and includes: transferring, by a polishing pad conditioner arm, a polishing pad conditioner disc to contact a pre-polishing pad fixedly disposed on a cleaning disc to perform a pre-polishing operation; after the pre-polishing operation is completed, transferring, by the polishing pad conditioner arm, the polishing pad conditioner disc to a polishing pad to perform an a polishing operation; and after the polishing operation is completed, transferring, by the polishing pad conditioner arm, the polishing pad conditioner disc to a position above the cleaning disc not in contact with the pre-polishing pad to perform a cleaning operation.

In a form, the pre-polishing operation includes: driving, by a rotation driver, the pre-polishing pad to rotate; supplying, by a pre-polishing grinding liquid dispensing assembly, a pre-polishing grinding liquid to the pre-polishing pad; and positioning, by the polishing pad conditioner arm, the polishing pad conditioner disc into contact with an upper surface of the rotating pre-polishing pad to perform the pre-polishing operation.

In a form, the polishing operation includes: driving, by a rotary disc, the polishing pad to rotate; supplying, by a polishing grinding liquid dispensing assembly, a polishing grinding liquid to the polishing pad; transferring, by the polishing pad conditioner arm, the polishing pad conditioner disc to the polishing pad; and performing, by the polishing pad, the polishing operation in combination with a grinding head and the polishing pad conditioner disc.

In a form, in a process of the polishing operation, the polishing pad conditioner arm drives the polishing pad conditioner disc to sweep over an upper surface of the polishing pad, and the grinding head also sweeps over the upper surface of the polishing pad.

In a form, the cleaning operation includes spraying, by a cleaning liquid dispensing assembly, a cleaning liquid onto an upper surface and a side face of the polishing pad conditioner disc for cleaning the polishing pad conditioner disc.

In a form, the method further includes: cyclically performing the pre-polishing operation, the polishing operation, and the cleaning operation.

The chemical mechanical polishing method of the present disclosure beneficially reduces wafer scratches and increases evenness of distribution of a grinding liquid during actual polishing.

Further, the foregoing chemical mechanical polishing device also beneficially saves consumption of a polishing grinding liquid.

Exemplary forms of the present disclosure are described in detail by referring to the following accompanying drawings.

BRIEF DESCRIPTION OF THE DRAWINGS

Accompanying drawings that constitute a part of the description describe forms of the present disclosure and are used, together with the description, to explain the principles of the present disclosure.

Referring to the accompanying drawings, the present disclosure can be understood more clearly according to the following detailed descriptions, wherein.

DETAILED DESCRIPTION

Figure 1:
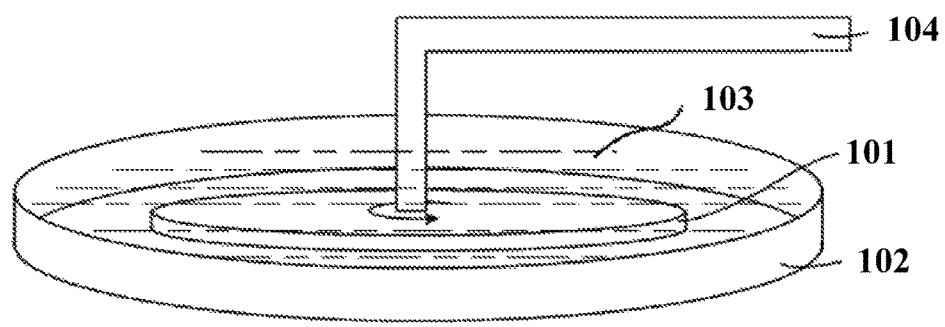
FIG. 1 is a schematic diagram illustratively showing a partial structure of an existing CMP device.

Various exemplary forms of the present disclosure are described now in detail by referring to the accompanying drawings. It should be noted that unless otherwise specified, the relative disposition, numerical expressions, and numerical values of the components and steps described in the forms do not limit the scope of the present disclosure.

Meanwhile, it should be understood that to facilitate the description, sizes of respective components in the drawings are not drawn according to actual proportional relationships.

The following descriptions are only exemplary and shall not be considered as any limitations to the present disclosure and application or use thereof.

The technologies, methods, and devices known by those of ordinary skill in the art may not be discussed in detail, but when appropriate, the technologies, methods, and devices should be regarded as a part of the present specification.

In all the examples shown and discussed herein, any specific values should be interpreted as being merely illustrative rather than limiting. Therefore, other examples of an exemplary form may have different values.

It should be noted that similar reference signs, labels, and letters represent similar items in the following accompanying drawings. Therefore, once a specific item is defined in one accompanying drawing, it is unnecessary to further discuss the item in the subsequent accompanying drawings.

Figure 2:
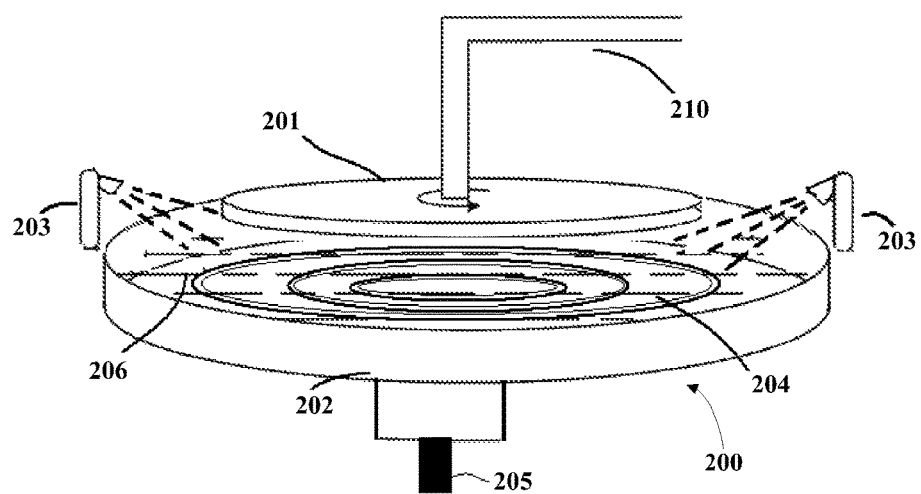
FIG. 2 is a schematic diagram illustratively showing a partial structure of a CMP device according to a form of the present disclosure.

FIG. 2 is a schematic diagram illustratively showing a partial structure of a CMP device according to a form of the present disclosure. The CMP device may include a polishing pad conditioner disc 201 and a cleaning apparatus 200. As an example, the polishing pad conditioner disc 201 may be a diamond disc. As shown in FIG. 2, the cleaning apparatus 200 may include a cleaning disc 202, a pre-polishing grinding liquid supply unit 203 (alternatively referred to as a pre-polishing liquid dispensing assembly), a pre-polishing pad 204, and a rotation driving unit 205 (alternatively referred to as a rotation driver).

The pre-polishing pad 204 is disposed inside the cleaning disc 202 and configured to perform a pre-polishing operation when in contact with the polishing pad conditioner disc 201. In an exemplary form, a range of a diameter of the pre-polishing pad 204 may be 20 cm to 22 cm, for example, 21 cm.

The pre-polishing grinding liquid supply unit 203 is disposed on a side edge of the cleaning disc 202 and configured to supply a pre-polishing grinding liquid 206 to the pre-polishing pad 204. In a form, as shown in FIG. 2, the pre-polishing grinding liquid supply unit 203 may include a pre-polishing grinding liquid nozzle disposed on the side edge of the cleaning disc 204. In a form, as shown in FIG. 2, the pre-polishing grinding liquid supply unit 203 may include two pre-polishing grinding liquid nozzles. The two pre-polishing grinding liquid nozzles are respectively disposed on two sides of the cleaning disc. In an exemplary form, a range of a flow rate of the pre-polishing grinding liquid may be 30 ml/min to 35 ml/min, for example, 33 ml/min.

In another form, the pre-polishing grinding liquid supply unit 203 may further include a conduit (not shown in the drawing) and the like connected to the pre-polishing grinding liquid nozzle.

The rotation driving unit 205 is configured to drive a rotation of the pre-polishing pad 204. For example, the rotation driving unit 205 may be a rotary motor. In a form, as shown in FIG. 2, the pre-polishing pad 204 is fixedly disposed inside the cleaning disc 202 and is coaxially connected to or coaxial with the cleaning disc 202; and the rotation driving unit 205 is coaxially connected to or coaxial with the cleaning disc. The rotation driving unit 205 drives the rotation of the cleaning disc 202 together with the pre-polishing pad 204. For example, a rotation speed of the cleaning disc 202 may be 15 r/min to 20 r/min (for example, 17 r/min). That is, an exemplary rotation speed of the pre-polishing pad 204 may be 15 r/min to 20 r/min (for example, 17 r/min).

In the foregoing form, the pre-polishing grinding liquid supply unit 203 supplies the pre-polishing grinding liquid 206 to the pre-polishing pad 20. The polishing pad conditioner arm 210 transfers the polishing pad conditioner disc 201 to the pre-polishing pad 204 and position the polishing pad conditioner disc 201 in contact with an upper surface of the pre-polishing pad 204. Because the polishing pad conditioner disc 201 and the pre-polishing pad 204 are both in a rotating state, a pre-polishing operation may be performed. As an example, a time period of the pre-polishing operation may be 10 seconds to 15 seconds (for example, 13 seconds). The pre-polishing operation may beneficially reduce wafer scratches when a polishing operation is performed and increase evenness of distribution of a grinding liquid during polishing. In addition, the pre-polishing operation also beneficially save consumption of a polishing grinding liquid.

In a form, in the process of performing the pre-polishing operation, a range of a rotation speed of the polishing pad conditioner disc 201 may be 15 r/m in to 20 r/min, for example, 17 r/min.

Figure 3:
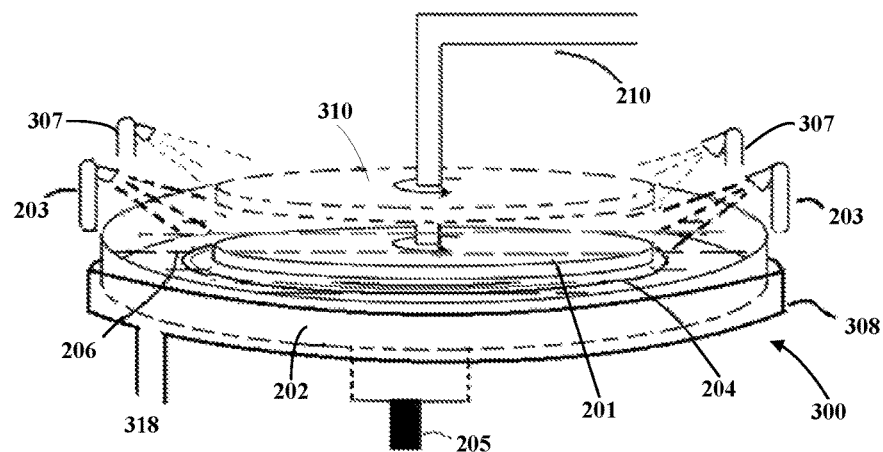
FIG. 3 is a schematic diagram illustratively showing a partial structure of a CMP device according to another form of the present disclosure.

FIG. 3 is a schematic diagram illustratively showing a partial structure of a CMP device according to another form of the present disclosure. As shown in FIG. 3, the CMP device may include a polishing pad conditioner disc 201 and a cleaning apparatus 300.

The cleaning apparatus 300 may include a cleaning disc 202, a pre-polishing grinding liquid supply unit 203, a pre-polishing pad 204, and a rotation driving unit 205, which may be the same or similar to the cleaning apparatus 200 shown in FIG. 2, and are not described again herein.

In a form, the cleaning apparatus 300 may further include a cleaning liquid supply unit 307 (alternatively referred to as a cleaning liquid dispensing assembly). The cleaning liquid supply unit 307 is disposed on the side edge of the cleaning disc 202 and configured to perform a cleaning operation on the polishing pad conditioner disc 201. When the cleaning liquid supply unit 307 performs the cleaning operation on the polishing pad conditioner disc 201, the polishing pad conditioner disc 201 is located above the cleaning disc 202, for example, at a dashed line position 310 shown in FIG. 3.

In a form, the cleaning liquid supply unit 307 may include a cleaning liquid nozzle disposed on the side edge of the cleaning disc 202. As shown in FIG. 3, the cleaning liquid supply unit 307 may alternatively include two cleaning liquid nozzles, which are respectively disposed on two sides of the cleaning disc 202. When the cleaning operation is being performed, the cleaning liquid supply unit 307 sprays a cleaning liquid (for example, DIW) onto the upper surface and a side face of the polishing pad conditioner disc 201. A range of a flow rate of the cleaning liquid may, for example, be 100 ml/min to 120 ml/min. For example, the flow rate may be 110 ml/min. In an exemplary form, a time of the cleaning operation may be 5 seconds to 8 seconds. In a form, the cleaning liquid supply unit 307 may further include a conduit (not shown in the drawing) and the like connected to the cleaning liquid nozzle.

In a form, the cleaning apparatus 300 may further include a liquid discharging disc 308. The liquid discharging disc 308 is disposed below the cleaning disc 202 and configured to discharge a waste liquid after the pre-polishing operation or cleaning operation. As shown in FIG. 3, the liquid discharging disc 308 may enclose the cleaning disc 202 and discharge the waste liquid through a liquid discharging opening 318. The waste liquid herein may be the grinding liquid after the pre-polishing operation or the cleaning liquid after the cleaning operation.

Figure 4:
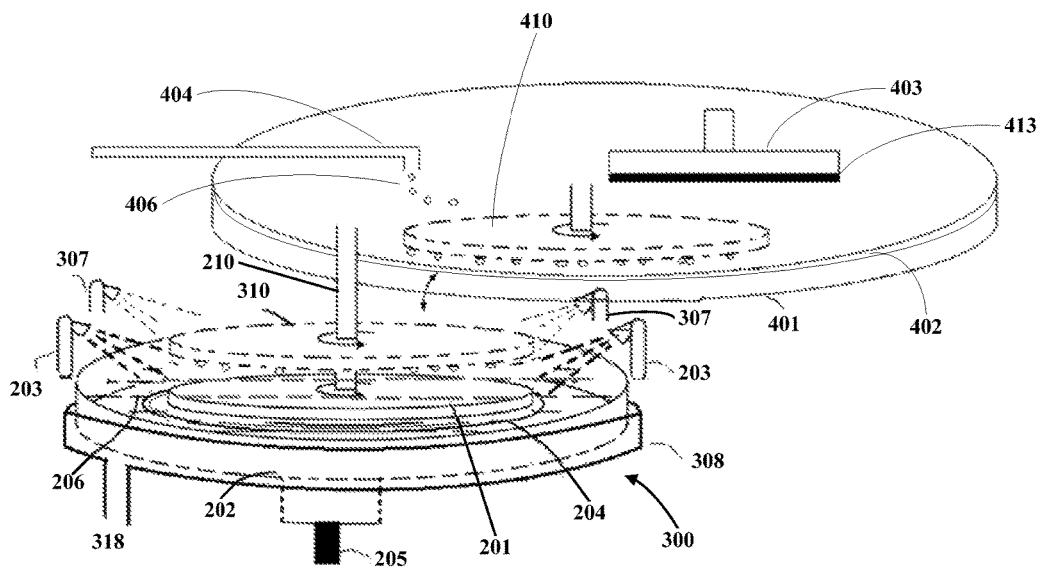
FIG. 4 is a schematic diagram illustratively showing a partial structure of a CMP device according to a form of the present disclosure.

FIG. 4 is a schematic diagram illustratively showing a partial structure of a CMP device according to a form of the present disclosure. The CMP device may include a polishing pad conditioner disc 201 and a cleaning apparatus 300.

In a form, the CMP device may further include: a rotary disc 401, a polishing pad 402, a grinding head 403, a polishing grinding liquid supply unit 404 (alternatively referred to as polishing grinding liquid dispensing assembly), and a polishing pad conditioner arm 210. The rotary disc 401 is configured to drive a rotation of the polishing pad 402. The polishing pad 402 is disposed on the rotary disc 401 and configured to perform a polishing operation in combination with the grinding head 403 and the polishing pad conditioner disc 201. For example, when the polishing operation is performed, a position of the polishing pad conditioner disc 201 may be at a dashed line position 410 shown in FIG. 4. The grinding head 403 is disposed above the polishing pad 402 and configured to get in contact with an upper surface of the polishing pad 402 when the polishing operation is performed. For example, when the polishing operation is performed, a wafer 413 of the grinding head 403 gets in contact with the upper surface of the polishing pad 402. The polishing grinding liquid supply unit 404 is disposed above the polishing pad 402 and configured to supply a polishing grinding liquid 406 to the polishing pad 402. For example, the polishing grinding liquid supply unit 404 may include two polishing grinding liquid nozzles. For another example, the polishing grinding liquid supply unit 404 may further include a conduit (not shown in the drawing) and the like connected to the polishing grinding liquid nozzle. The polishing pad conditioner arm 210 is connected to the polishing pad conditioner disc 201 and configured to move the polishing pad conditioner disc 201.

In a form, in the polishing operation, a range of a flow rate of the polishing grinding liquid 406 may be 140 ml/min to 150 ml/min. For example, the flow rate may be 145 ml/min.

Figure 5:
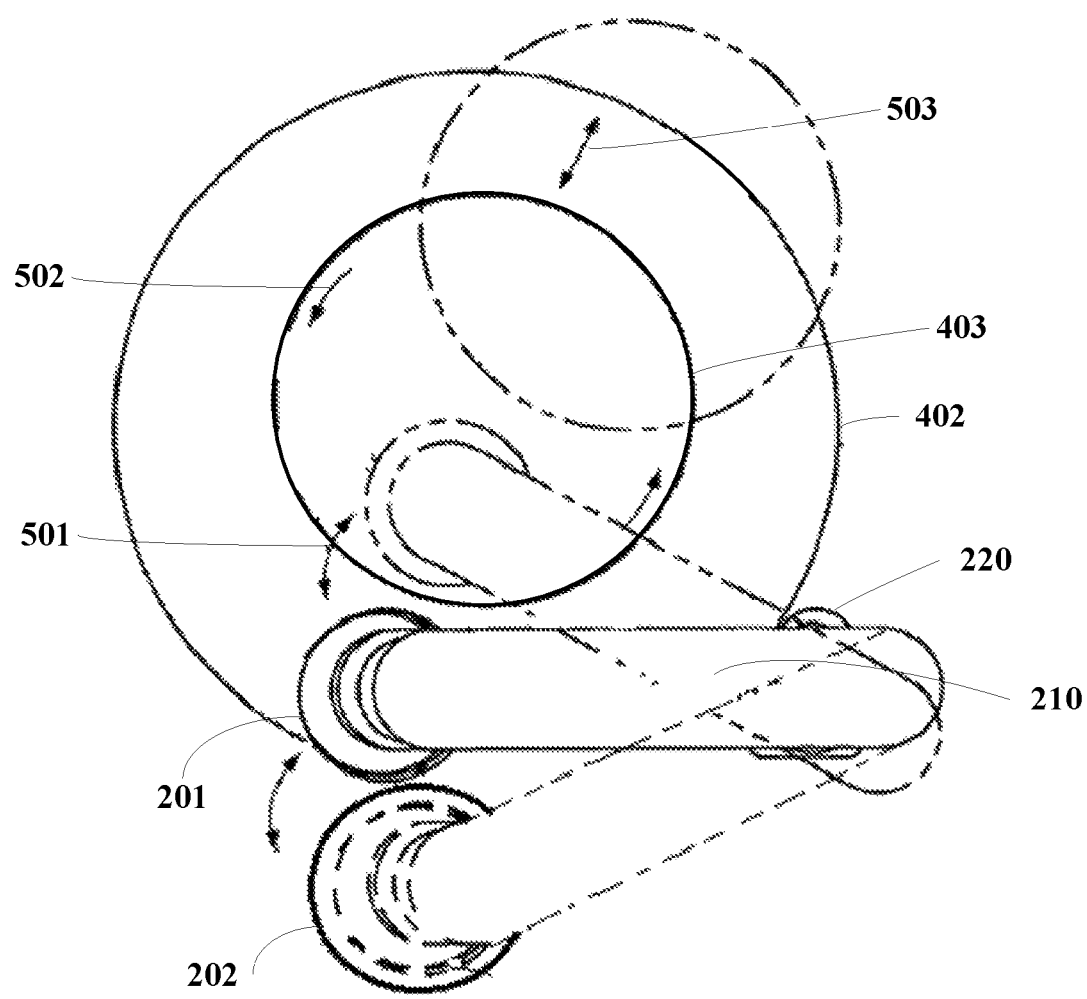
FIG. 5 is a schematic diagram illustrating a function of a CMP device according to a form of the present disclosure.

FIG. 5 is a schematic diagram illustratively showing a working of a CMP device according to a form of the present disclosure. FIG. 5 shows a polishing pad conditioner disc 201, a polishing pad conditioner arm 210, a polishing pad conditioner housing 220, a cleaning disc 202, a polishing pad 402, a grinding head 403, a sweeping direction 501 of the polishing pad conditioner disc, a rotating direction 502 of the grinding head, and a sweeping direction 503 of the grinding head.

A pre-polishing grinding liquid supply unit supplies the pre-polishing grinding liquid to the pre-polishing pad (204) in the cleaning disc (202), and the polishing pad conditioner disc (201) may be positioned in contact with the pre-polishing pad (204) to perform a pre-polishing operation.

Then, after the pre-polishing operation is completed, the polishing pad conditioner arm 210 transfers the polishing pad conditioner disc 201 to the polishing pad 402 to perform a polishing operation. In the polishing operation process, the polishing pad conditioner arm 210 drives the polishing pad conditioner disc 201 to sweep over an upper surface of the polishing pad 402, as shown by the direction 501 in FIG. 5 (which can increase roughness of the surface of the polishing pad and may also remove the used grinding liquid). The grinding head 403 also sweeps over the upper surface of the polishing pad 402, as shown by the direction 503 in FIG. 5.

Subsequently, after the polishing operation is completed, the polishing pad conditioner arm 210 transfers the polishing pad conditioner disc 201 to a position above a cleaning disc 202 to perform a cleaning operation. Thus, a working cycle is completed.

Further, after the cleaning operation is completed, the polishing pad conditioner disc 201 is further positioned in contact with the pre-polishing pad 204 to perform a pre-polishing operation of a next working cycle. Then a polishing operation and a cleaning operation are further performed, and three operations may be cyclically performed.

Figure 6:
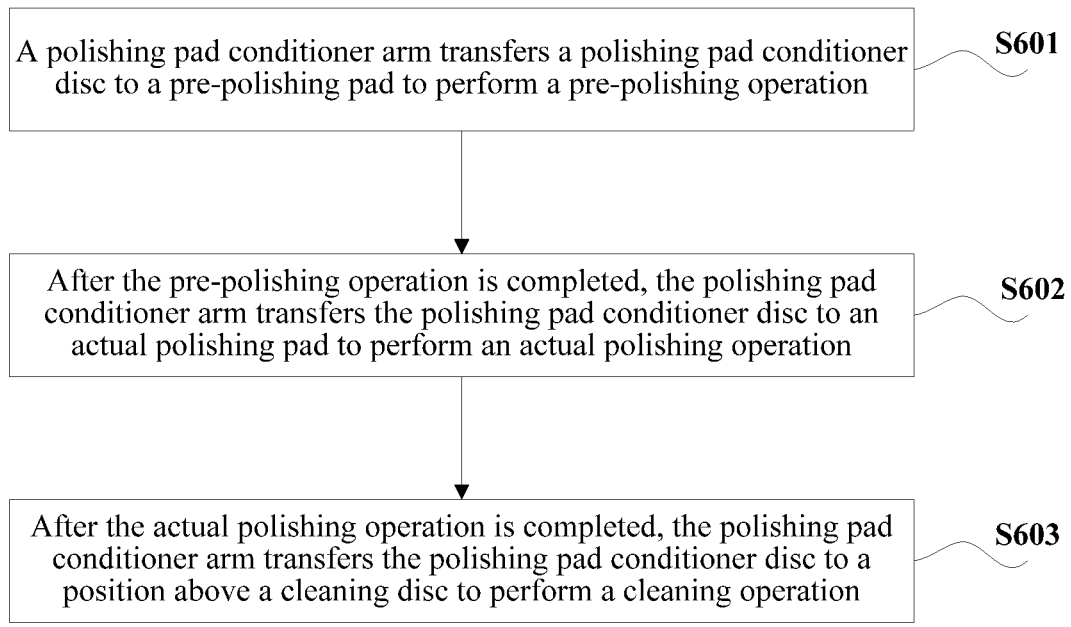
FIG. 6 is a flowchart illustratively showing a chemical mechanical polishing method according to a form of the present disclosure.

FIG. 6 is a logic flow illustratively showing a chemical mechanical polishing method according to a form of the present disclosure.

Step S601: A polishing pad conditioner arm transfers a polishing pad conditioner disc to a pre-polishing pad to perform a pre-polishing operation.

In a form, the pre-polishing operation includes: driving, by the rotation driving unit 205, the pre-polishing pad 204 to rotate; supplying, by the pre-polishing grinding liquid supply unit 203, the pre-polishing grinding liquid 206 to the pre-polishing pad 204; and positioning the polishing pad conditioner disc 201, by the polishing pad conditioner arm 210, into contact with an upper surface of the rotating pre-polishing pad 204 to perform the pre-polishing operation.

Step S602: After the pre-polishing operation is completed, the polishing pad conditioner arm 210 transfers the polishing pad conditioner disc 201 to a polishing pad to perform a polishing operation.

In a form, the polishing operation includes that: driving, by the rotary disc 401, a polishing pad 402 to rotate; supplying, by the polishing grinding liquid supply unit 404, the polishing grinding liquid 406 to the polishing pad 402; transferring, by the polishing pad conditioner arm 210, the polishing pad conditioner disc 201 to the polishing pad 402; and performing, by the polishing pad 402, the polishing operation in combination with the grinding head 403 and the polishing pad conditioner disc 201.

In a form, in a process of the polishing operation, the polishing pad conditioner arm 210 drives the polishing pad conditioner disc 201 to sweep over an upper surface of the polishing pad 402, and the grinding head 403 also sweeps over the upper surface of the polishing pad 402.

Step S603: After the polishing operation is completed, the polishing pad conditioner arm 210 transfers the polishing pad conditioner disc 201 to a position above a cleaning disc 202 to perform a cleaning operation.

In a form, the cleaning operation includes that: spraying, by the cleaning liquid supply unit 307, the cleaning liquid (for example, DIW) onto the upper surface and a side face of the polishing pad conditioner disc 201 for cleaning the polishing pad conditioner disc 201.

Thus, a working cycle of the CMP is completed by using the foregoing chemical mechanical polishing method.

In a form, the foregoing chemical mechanical polishing method may further include: cyclically performing the pre-polishing operation, the polishing operation, and the cleaning operation.

In the forms of the present disclosure, objectives and advantages of the foregoing pre-polishing operation may include the following:

(1) When a polishing operation is performed, some scratches that occur in the polishing operation are caused by diamond particles falling from a surface of a polishing pad conditioner disc. The foregoing pre-polishing operation may remove some diamond particles from the polishing pad conditioner disc and transfer the particles into the cleaning disc. As such, the amount of diamond particles falling onto the polishing pad is reduced, decreasing wafer scratches.

(2) Evenness of distribution of a grinding liquid on a polishing pad may be improved. The grinding liquid on the polishing pad may include two contributions: a first contribution from the polishing grinding liquid supply unit; and a second contribution from the grinding liquid adhered to the surface of the polishing pad conditioner disc (for example, a diamond disc) in the pre-polishing operation. The second contribution is brought to the polishing pad from the pre-polishing operation (which utilizes unevenness of the surface of the polishing pad conditioner disc and viscosity of the grinding liquid). That is, in the process of performing the polishing, some grinding liquid has been evenly adhered to the polishing pad conditioner disc in advance, so that evenness of the grinding liquid in the polishing process may be increased.

(3) Consumption of a grinding liquid may be decreased. The grinding liquid adhered to the polishing pad conditioner disc is directly brought to the polishing pad to be used in the polishing operation. As such, the grinding liquid outputted by the polishing grinding liquid supply unit can be reduced, thereby optimizing consumption and utilization of the grinding liquid. For example, a flow rate of the grinding liquid in the prior art is 200 ml/min to 220 ml/min, but in the present disclosure, a flow rate of the grinding liquid may be reduced to a range of 140 ml/min to 150 ml/min.

Various forms of the present disclosure are described in detail above. However, in order to prevent obscuring the idea of the present disclosure, some well-known details in the art are not described. According to the foregoing descriptions, those skilled in the art understand how to carry out the technical solutions disclosed herein.

Although some specific forms of the present disclosure are described in detail by using examples, those skilled in the art should understand that the foregoing forms are merely examples and are not intended to limit the scope of the present disclosure. Those of ordinary skill in the art should understand that the foregoing forms may be modified without departing from the scope and spirit of the present disclosure. The scope of the present disclosure is defined by the appended claims.

What is claimed is:

1. A chemical mechanical polishing device, comprising a cleaning apparatus and a polishing pad conditioner disc positionally configurable relative to the cleaning apparatus, wherein the cleaning apparatus comprises:
   a cleaning disc;
   a pre-polishing pad disposed inside the cleaning disc and configured to perform a pre-polishing operation of the polishing pad conditioner disc when positioned in contact with the polishing pad conditioner disc;
   a pre-polishing grinding liquid dispensing assembly disposed on a side edge of the cleaning disc and configured to supply a pre-polishing grinding liquid to the pre-polishing pad; and
   a rotation driver configured to drive the pre-polishing pad to rotate during the pre-polishing operation.

2. The chemical mechanical polishing device according to claim 1, wherein:
   a diameter of the pre-polishing pad ranges between 20 cm and 22 cm.

3. The chemical mechanical polishing device according to claim 1, wherein:
   the pre-polishing pad is fixedly disposed inside the cleaning disc and is coaxial with the cleaning disc; and
   the rotation driver is coaxially connected to the cleaning disc.

4. The chemical mechanical polishing device according to claim 3, wherein:
   a rotation speed of the cleaning disc ranges between 15 r/min and 20 r/min.

5. The chemical mechanical polishing device according to claim 1, wherein:
   the pre-polishing grinding liquid dispensing assembly comprises a pre-polishing grinding liquid nozzle disposed on the side edge of the cleaning disc.

6. The chemical mechanical polishing device according to claim 5, wherein:
   the pre-polishing grinding liquid dispensing assembly comprises two pre-polishing grinding liquid nozzles, wherein the two pre-polishing grinding liquid nozzles are respectively disposed on two sides of the cleaning disc.

7. The chemical mechanical polishing device according to claim 1, wherein:
   a flow rate of the pre-polishing grinding liquid ranges between 30 ml/min and 35 ml/min.

8. The chemical mechanical polishing device according to claim 1, wherein:
   in a process of performing the pre-polishing operation, a rotation speed of the polishing pad conditioner disc ranges between 15 r/min and 20 r/min.

9. The chemical mechanical polishing device according to claim 1, wherein the polishing pad conditioner disc comprises a diamond disc.

10. The chemical mechanical polishing device according to claim 1, wherein the cleaning apparatus further comprises:
    a cleaning liquid dispensing assembly, disposed on the side edge of the cleaning disc and configured to perform a cleaning operation on the polishing pad conditioner disc.

11. The chemical mechanical polishing device according to claim 10, wherein:
    when the cleaning liquid dispensing assembly performs the cleaning operation on the polishing pad conditioner disc, the polishing pad conditioner disc is positioned above the cleaning disc.

12. The chemical mechanical polishing device according to claim 10, wherein:
    the cleaning liquid dispensing assembly comprises a cleaning liquid nozzle disposed on the side edge of the cleaning disc.

13. The chemical mechanical polishing device according to claim 12, wherein:
    the cleaning liquid dispensing assembly comprises two cleaning liquid nozzles respectively disposed on two sides of the cleaning disc.

14. The chemical mechanical polishing device according to claim 12, wherein:
    a flow rate of the cleaning liquid ranges between 100 ml/min and 120 ml/min.

15. The chemical mechanical polishing device according to claim 10, wherein the cleaning apparatus further comprises:
    a liquid discharging disc, disposed below the cleaning disc and configured to discharge a waste liquid after the pre-polishing operation or the cleaning operation.

16. The chemical mechanical polishing device according to claim 10, further comprising: a rotary disc, a polishing pad, a grinding head, a polishing grinding liquid dispensing assembly, and a polishing pad conditioner arm, wherein:
    the rotary disc is configured to drive the polishing pad to rotate;
    the polishing pad is disposed on the rotary disc and configured to perform a polishing operation in combination with the grinding head and the polishing pad conditioner disc;
    the grinding head is disposed above the polishing pad and configured to hold a wafer and position the wafer into contact with an upper surface of the polishing pad when the polishing operation is performed;
    the polishing grinding liquid dispensing assembly is disposed above the polishing pad and configured to supply a polishing grinding liquid to the polishing pad; and
    the polishing pad conditioner arm is connected to the polishing pad conditioner disc and configured to move the polishing pad conditioner disc relative to the polishing pad.

17. The chemical mechanical polishing device according to claim 16, wherein:
    a flow rate of the polishing grinding liquid ranges between 140 ml/min and 150 ml/min.

18. A chemical mechanical polishing method, comprising:
    transferring, by a polishing pad conditioner arm, a polishing pad conditioner disc to contact a pre-polishing pad fixedly disposed on a cleaning disc to perform a pre-polishing operation;
    after the pre-polishing operation is completed, transferring, by the polishing pad conditioner arm, the polishing pad conditioner disc to a polishing pad to perform a polishing operation; and
    after the polishing operation is completed, transferring, by the polishing pad conditioner arm, the polishing pad conditioner disc to a position above the cleaning disc not in contact with the pre-polishing pad to perform a cleaning operation.

19. The method according to claim 18, wherein the pre-polishing operation comprises that:
    driving, by a rotation driver, the pre-polishing pad to rotate;

supplying, by a pre-polishing grinding liquid dispensing assembly, a pre-polishing grinding liquid to the pre-polishing pad; and positioning, by the polishing pad conditioner arm, the polishing pad conditioner disc into contact with an upper surface of the rotating pre-polishing pad to perform the pre-polishing operation.

20. The method according to claim 18, wherein the polishing operation comprises that:

driving, by a rotary disc, the polishing pad to rotate;

supplying, by a polishing grinding liquid dispensing assembly, a polishing grinding liquid to the polishing pad;

transferring, by the polishing pad conditioner arm, the polishing pad conditioner disc to the polishing pad; and performing, by the polishing pad, the polishing operation in combination with a grinding head and the polishing pad conditioner disc.

21. The method according to claim 20, wherein:

in a process of the polishing operation, the polishing pad conditioner arm drives the polishing pad conditioner disc to sweep over an upper surface of the polishing pad, and the grinding head also sweeps over the upper surface of the polishing pad.

22. The method according to claim 18, wherein the cleaning operation comprises:

spraying, by a cleaning liquid dispensing assembly, a cleaning liquid onto an upper surface and a side face of the polishing pad conditioner disc for cleaning the polishing pad conditioner disc.

23. The method according to claim 18, further comprising:

cyclically performing the pre-polishing operation, the polishing operation, and the cleaning operation.

* * * * *